Dec. 9, 1969 C. N. LYNK, JR., ET AL 3,483,473
FREQUENCY CONVERTING AND SELECTING SYSTEM INCLUDING MIXER
CIRCUIT WITH FIELD EFFECT TRANSISTOR COUPLED TO BAND-PASS
FILTER THROUGH IMPEDANCE INVERTING CIRCUIT
Filed April 4, 1966
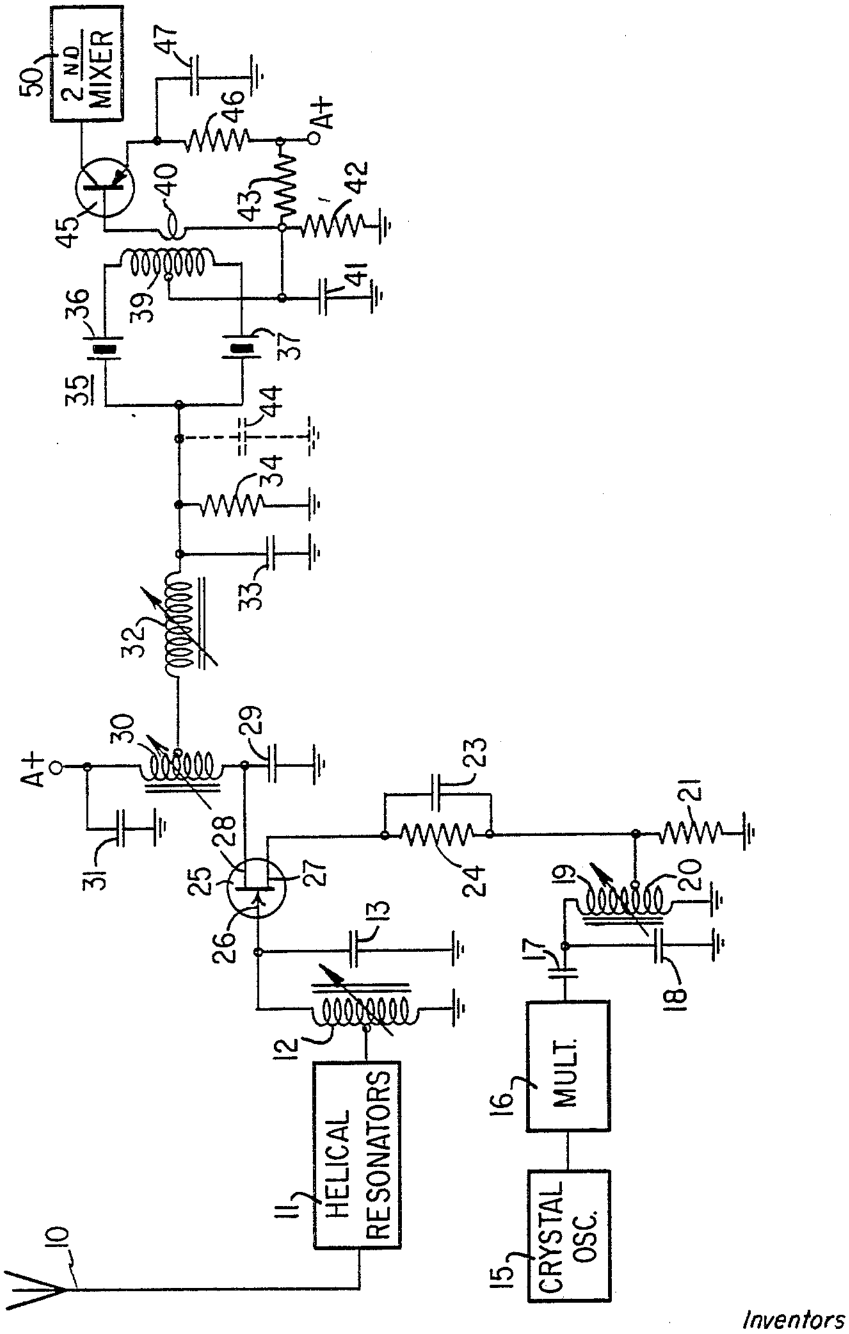
Inventors
CHARLES N. LYNK JR.
RONALD L. KACZMAREK
BY
Mueller, Aichele & Rauner
ATTYS.

3,483,473

FREQUENCY CONVERTING AND SELECTING SYSTEM INCLUDING MIXER CIRCUIT WITH FIELD EFFECT TRANSISTOR COUPLED TO BAND-PASS FILTER THROUGH IMPEDANCE INVERTING CIRCUIT

Charles N. Lynk, Jr., Elmwood Park, and Ronald L. Kaczmarek, Melrose Park, Ill., assignors to Motorola, Inc., Franklin Park, Ill., a corporation of Illinois Filed Apr. 4, 1966, Ser. No. 539,984
Int. Cl. H04b *1/28;* H03h *9/00*
U.S. Cl. 325—436 9 Claims

ABSTRACT OF THE DISCLOSURE

Frequency converting and selecting system for superheterodyne receiver including field effect transistor operating as mixer, with the received signals and local oscillations being applied to the source and gate electrodes, and an output circuit coupled to the drain electrode. The difference frequencies in the mixer output are selected by a highly selective band-pass filter which may include quartz crystals or other piezoelectric resonating elements. The band-pass filter is connected to the mixer output circuit by an impedance inverting circuit which translates the high input impedance of the crystal filter for frequencies adjacent the band selected to a low impedance at the mixer output circuit.

This invention relates generally to mixer circuits for superheterodyne receivers, and particularly to a mixer and selector circuit including a field effect transistor and a band-pass filter.

In highly sensitive radio communication receivers it is desired to select the received signals within a given frequency band without introducing intermodulation components. The desired signals may be relatively weak and may be accompanied by stronger signals closely adjacent to the band of the desired signals. Circuits for converting the frequency of the received signals, to reduce the frequency to facilitate amplification of the signals, tend to have non-linearities and these cause mixing of the strong signals outside the band to produce intermodulation components. These components may fall within the band of the receiver and, therefore, pass through the receiver with the desired signals.

One problem which has been encountered is that highly selective band-pass filters, such as filters with piezoelectric resonating elements, present a high input impedance at frequencies outside but closely adjacent to the band of the filter. This high impedance forms a load across which undesired signals can build up to substantial amplitudes. Although the signals outside the band are rejected by the filter, these signals can cause intermodulation in the circuits prior to the filter which can fall within the pass-band of the filter and pass therethrough with the desired signals.

It is, therefore, an object of the present invention to provide an improved mixer and selector circuit wherein intermodulation components are held to a minimum.

Another object of the invention is to provide a mixer circuit having a mixing device and a highly selected filter, wherein the filter is coupled to the mixer in a manner to minimize the production of intermodulation components which fall within the band-pass filter.

A feature of the invention is the provision of a mixer circuit including a field effect transistor to which signals and local oscillations are applied so that the difference signal is developed in an output circuit and wherein a bandpass filter having piezoelectric resonators is coupled to the mixer output circuit through an impedance inverter which translates the high input impedance of the band-pass filter at frequencies adjacent the band to relatively low impedance.

Another feature of the invention is the provision of a mixer circuit including a field effect transistor with the received waves being applied between the gate and ground, and local oscillations being applied between the source and ground, and with an output circuit connected to the drain which is tuned to the difference frequency between the received waves and the local oscillations. A band-pass filter having piezoelectric resonators is coupled to the output circuit by a series coil and a shunt capacitor, with the shunt capacitor together with the effective shunt capacity of the band-pass filter and the coil being series resonant at the intermediate frequency and acting to invert the input impedance of the band-pass filter, so that the high input impedance thereof at frequencies adjacent the band is converted to low impedance and there is no adequate load for development of strong signals adjacent the band which could cause intermodulation and produce components within the band of the filter.

The invention is illustrated in the drawing wherein the single figure is a circuit diagram of the mixer and selector circuit as used in a superheterodyne receiver.

In practicing the invention, received signals are selected and coupled to the gate of a field effect transistor, and local oscillations are applied at a relatively high level to the source of the field effect transistor. The received signals are effectively applied between the gate and the source, and the local oscillations between the source and gate of the field effect transistor. An output circuit is coupled to the drain of the field effect transistor and is tuned to the difference frequency between the received signals and the local oscillations. The difference frequencies are further selected by a highly selective band-pass filter which is of the lattice type and includes piezoelectric resonating elements such as quartz crystals or barium titanate resonators.

The band-pass filter is connected to the output circuit of the transistor by an impedance inverting circuit including a series coil and a shunt capacitor. The impedance inverter has the characteristic of a quarter to low impedance at its input. This may be provided by tuning the series inductor by the shunt capacitor in parallel with the effective shunt capacity of the filter, so that the circuit is series resonant at the center frequency of the band to be selected. A resistor may be connected across the shunt capacitor to load the circuit so that the tuning is less critical. The band-pass filter has a very sharp selectivity characteristic and effectively rejects signals outside the band. However, the band-pass filter has relatively high input impedance at frequencies adjacent to but outside the band, and could form a load across which high amplitude signals at frequencies outside the band might be developed. Such signals can mix with each other in the nonlinear output of the field effect transistor to provide intermodulation components within the band of the filter. The impedance inverter reduces the effective impedance of the filter presented to the tuned output circuit of the field effect transistor at frequencies outside the band. Therefore, there is no load across which strong signals can be developed, and the possibility that intermodulation components will be produced in the drain circuit of the field effect transistor which are within the pass band of the filter is minimized.

Referring now to the drawing, the mixer circuit of the invention is shown in a receiver wherein radio waves are derived by antenna 10 and selected in a resonant device 11 which may be a helical resonator or a cavity. The selected waves are applied to a tape on inductor 12, which is tuned by capacitor 13 to the frequency of the desired waves.

Local oscillations are provided by crystal oscillator 15, with the frequency of the oscillations being increased in multiplier 16. The oscillations are coupled through capacitor 17 to the tuned circuit including capacitor 18 and coil 19. The output is derived from the tap 20 on coil 19, which is selected to provide the proper level of oscillation injection, and to provide adequate stability and sensitivity. Resistor 21 is connected between the tap 20 on coil 19 and ground to increase the stability.

The received waves and local oscillations are applied to the field effect transistor 25, with the received waves being applied to the gate 26 thereof. The local oscillations are applied through bias network including resistor 24 and capacitor 23 to the source electrode 27 of the field effect transistor. The drain electrode 28 is connected to the tuned output circuit including capacitor 29 and inductor 30. The positive supply potential is applied to inductor 30, and capacitor 31 bypasses the supply potential. The output circuit is tuned to the difference frequency between the received radio waves and the local oscillations.

The received waves are effectively applied to the field effect transistor between the gate 26 and the source 27, as the tap 20 on coil 19 presents a low impedance to ground. The local oscillations are effectively applied between the source 27 and the gate 26, since the capacitor 13 presents a low impedance to the local oscillations. The field effect transistor has a square law characteristic with reference to signals so applied, and the drain current is the product of the two applied signals and therefore includes both the sum and difference frequencies. The inductor 30 with the capacitors coupled thereto is tuned to the difference frequency between the two applied signals.

Output signals are derived from inductor 30 at a tap thereon and applied to the coupling circuit including inductor 32, capacitor 33 and load resistor 34. The signal across the load resistor is applied to the filter 35 including piezoelectric resonating elements 36 and 37. The filter is of the known lattice type and includes an output transformer 38 having a tapped primary winding 39. The tap is connected to ground through capacitor 41 and resistor 42 in parallel. The secondary winding 40 of the transformer is also connected between the center tap and the base of transistor 45. The emitter of transistor 45 is connected to a positive potential through resistor 46, and the base is biased by the divider formed by resistors 42 and 43. Capacitor 47 bypasses the emitter. Transistor 45 forms an amplifier to apply signals selected by the crystal filter to the second mixer 50.

The crystal filter has a very sharp characteristic and has a very high impedance outside the band of frequencies selected. This high impedance outside the band waves forms an effective load to the signals developed in the drain circuit of field effect transistor and can cause objectionable intermodulation therein. The coupling circuit including coil 32 and capacitor 33 cooperates with the output circuit including coil 30 and capacitor 29 to form an impedance inverter which has a characteristic similar to that of a quarter wave line. This acts to convert the high impedance of the filter outside the selected band, to a low impedance, so that signals which are outside the band of the filter do not develop to significant levels. The impedance inverting action of the coupling circuit is obtained by making the coil 32 series resonant with the capacitor 33, in parallel with the equivalent shunt capacity of the crystal filter at the center frequency of the band to be selected. The shunt capacity of the crystal filter is represented by the capacitor 44, shown connected by dotted lines. The resistor 34 acts to load the circuit so that the tuning is less critical.

In a specific example, the crystal filter operates at a center frequency of 8 megacycles and has a bandwidth of ±8 kilocycles. The impedance of the filter at center frequency is of the order of 1800 ohms and at the adjacent channel (30 kilocycles away) is much higher, being of the order of 100,000 ohms. By use of the impedance inverting circuit, the impedance presented to the drain of the field effect transistor 25 is of the order of 10,000 ohms at center frequency, and is only about 5000 ohms at the adjacent channel (30 kilocycles away). The increased impedance of the filter outside the band is, therefore, inverted to provide a reduced impedance at the drain of the field effect transistor.

The impedance inverting action can be provided by networks other than the series resonant circuit shown. For example, either a pi or a T network can be used to simulate a quarter wave line. The series circuit shown together with the tuned output circuit of the field effect transistor can be considered a pi network. A quarter wave line could be used where this would not be objectionably large and expensive.

The use of the impedance inverting circuit effectively reduces the levels of signals outside the band of the filter in the drain circuit of the field effect transistor. This, therefore, reduces the intermodulation action in the drain circuit and minimizes the production of intermodulation components at frequencies within the pass band of the filter. It is to be pointed out that the intermodulation components outside the pass band of the crystal filter are rejected by the filter and, therefore, do not interfere with the desired signals, but the input impedance characteristic of the crystal filter without the impedance inverting circuit could cause a build up of signals outside the band which through intermodulation action in the drain circuit might produce components within the pass band of the filter.

The mixer circuit of the invention has been found to be highly effective in very sensitive communication type radio receivers. Input signals can be applied directly from the antenna through a cavity or other tuning device to the gate electrode of the field effect transistor. A radio frequency amplifier is, therefore, not required and the intermodulation problems resulting from such an amplifier are eliminated. The output of the field effect transistor is selected in a band-pass filter which may include piezoelectric elements providing a very sharp response and which is coupled to the field effect transistor by an impedance inverting circuit. The impedance applied to the drain of the field effect transistor at frequencies adjacent to the band is low, so that signals of such frequencies do not build up to large amplitudes and the objectionable intermodulation produced thereby is minimized.

We claim:

1. A frequency converting and selecting system for a superheterodyne receiver including in combination, a field effect transistor having source, drain and gate electrodes, selecting means for applying received waves between said gate and source electrodes of said field effect transistor, local oscillator means for providing local oscillations and applying the same between said source and gate electrodes of said field effect transistor, output circuit means coupled to said drain electrode of said field effect transistor for selecting the difference frequency signals produced from the received waves and the local oscillations, a band-pass filter for selecting said difference frequency signals in a predetermined band, said band-pass filter including piezoelectric resonating elements and presenting a high input impedance at frequencies outside of and adjacent to the predetermined band, and impedance inverting means coupling said band-pass filter to said output circuit means and translating the high impedance of said filter at frequencies adjacent the band to relatively low impedance at said output circuit means.

2. A system in accordance with claim 1 wherein said selecting means includes a tuned matching circuit connected to said gate electrode of said field effect transistor for applying received waves thereto.

3. A system in accordance with claim 1 wherein said local oscillator means includes a tuned output circuit including a coil having a tap thereon, and means connecting said tap on said coil to said source electrode of said field effect transistor for applying thereto local oscillations at a predetermined level.

4. A system in accordance with claim 1 wherein said impedance inverting means includes a series coil connecting said output circuit means to the input of said filter and a capacitor connected across the input of said filter, and wherein said capacitor together with the shunt capacitance of said filter and said coil are series resonant at the center frequency of said band pass filter.

5. A system in accordance with claim 4 including resistance means connected in parallel with said capacitor for rendering the tuning of said impedance inverting means less critical.

6. A frequency converting and selecting system for a superheterodyne receiver including in combination, a mixing device having input electrodes and an output electrode and having a square law characteristic, selecting means for deriving received waves in a given frequency band, local oscillator means for providing local oscillations, means for applying said derived received waves and said local oscillations to said input electrodes, output circuit means coupled to said output electrodes of said mixing device for selecting the difference frequency signals produced from the received waves and the local oscillations, and a band-pass filter for selecting the difference frequency signals in a predetermined band, said band-pass filter including piezoelectric resonating elements and presenting a high input impedance at frequencies immediately adjacent the band thereof, said output circuit means including impedance inverting means coupled to said band-pass filter for translating the high input impedance of said filter at frequencies adjacent the band to a substantially lower impedance at said output circuit means.

7. A system in accordance with claim 6 wherein said band-pass filter is of the lattice type and said piezoelectric resonating elements are quartz crystal.

8. A system in accordance with claim 6 wherein said impedance inverting means includes a series coil connected to the input of said filter and a capacitor connected across the input of said filter, and wherein said capacitor together with the shunt capacitance of said filter are series resonant with said coil at the center frequency of said band-pass filter.

9. A system in accordance with claim 8 including resistance means connected in parallel with said capacitor for rendering the tuning of said impedance inverting means less critical.

References Cited

UNITED STATES PATENTS

| | | | |
|---|---|---|---|
| 2,266,658 | 12/1941 | Robinson | 325—489 XR |
| 2,313,182 | 3/1943 | Thompson | 330—174 XR |
| 3,217,096 | 11/1965 | Caprio et al. | 325—489 XR |
| 3,307,110 | 2/1967 | Harwood | 307—304 XR |
| 3,348,154 | 10/1967 | Fish et al. | 325—451 |

ROBERT L. GRIFFIN, Primary Examiner

R. S. BELL, Assistant Examiner

U.S. Cl. X.R.

307—304; 325—472; 330—174